US010002917B2

United States Patent
Xu et al.

(10) Patent No.: US 10,002,917 B2
(45) Date of Patent: Jun. 19, 2018

(54) CIRCUIT AND METHOD FOR REPAIRING SIGNAL LINE DISCONNECTION AND DISPLAY PANEL

(71) Applicant: BOE TECHNOLOGY GROUP CO., LTD., Beijing (CN)

(72) Inventors: Jingbo Xu, Beijing (CN); Hongbo Feng, Beijing (CN); Yingzi Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days. days.

(21) Appl. No.: 15/532,471

(22) PCT Filed: May 24, 2016

(86) PCT No.: PCT/CN2016/083125
§ 371 (c)(1),
(2) Date: Jun. 1, 2017

(87) PCT Pub. No.: WO2017/156867
PCT Pub. Date: Sep. 21, 2017

(65) Prior Publication Data
US 2018/0047801 A1    Feb. 15, 2018

(30) Foreign Application Priority Data
Mar. 17, 2016   (CN) .......................... 2016 1 0154528

(51) Int. Cl.
*H01L 27/32*   (2006.01)
*G01R 31/28*   (2006.01)
(Continued)

(52) U.S. Cl.
CPC ...... *H01L 27/3276* (2013.01); *G01R 31/2812* (2013.01); *G06F 3/0412* (2013.01);
(Continued)

(58) Field of Classification Search
CPC ..... G06F 3/041–3/047; G09G 2330/08; G09G 2330/12; G09G 3/006; H01L 27/1244; G01R 31/28; G01R 31/2812
See application file for complete search history.

(56) References Cited

U.S. PATENT DOCUMENTS 6,816,143 B1 *  11/2004  Lambert ............. G09G 3/3688
                                                345/100
8,083,561 B1    12/2011  Huang et al.
(Continued)

FOREIGN PATENT DOCUMENTS

CN    1797141         7/2006
CN    1797141 A  *   7/2006  ............ G02F 1/136
(Continued)

OTHER PUBLICATIONS

International Search Report and Written Opinion in PCT/CN2016/083125 dated Nov. 29, 2016, with English translation ( 14 pages).
(Continued)

*Primary Examiner* — Larry Lee
(74) *Attorney, Agent, or Firm* — Womble Bond Dickinson (US) LLP (57) ABSTRACT

The present disclosure provides a circuit and method for repairing signal line disconnection and a display panel associated therewith. The circuit comprises a signal analysis module, a first control module and a second control module. The signal analysis module detects signals at a first and second node of a first signal line, and outputs a control signal at its output under control of the signals at the first and second node. Under control of the control signal, the first control module conductively connects the first node of a first signal line with a first node of a second signal line, and the second control module conductively connects the second node of the first signal line with a second node of the second signal line. The present disclosure may be applied to manu-
(Continued)

facturing of displays, which solves the problem that existing approaches for repairing signal line disconnection are time-consuming and low-efficiency.

20 Claims, 4 Drawing Sheets (51) Int. Cl.
G09G 3/20 (2006.01)
G06F 3/041 (2006.01)
H01L 27/12 (2006.01)

(52) U.S. Cl.
CPC ....... *G09G 3/2092* (2013.01); *H01L 27/1244* (2013.01); *H01L 27/3262* (2013.01); *G09G 2310/0243* (2013.01); *G09G 2310/0264* (2013.01); *G09G 2330/08* (2013.01); *G09G 2370/00* (2013.01)

(56) References Cited

U.S. PATENT DOCUMENTS

| | | | |
|---|---|---|---|
| 2002/0107872 A1 | 8/2002 | Hudis et al. | |
| 2002/0144009 A1 | 10/2002 | Cheng et al. | |
| 2002/0199022 A1 | 12/2002 | Tsang et al. | |
| 2009/0077669 A1* | 3/2009 | Buer | G06F 21/86 726/26 |
| 2012/0038834 A1* | 2/2012 | Kitayama | G02F 1/136286 348/731 |
| 2014/0028654 A1 | 1/2014 | Saitoh et al. | |
| 2014/0055685 A1 | 2/2014 | Wang et al. | |
| 2017/0185223 A1* | 6/2017 | Lu | G06F 3/0412 |

FOREIGN PATENT DOCUMENTS

| | | |
|---|---|---|
| CN | 1797141 A | 7/2006 |
| CN | 101408681 A | 4/2009 |
| CN | 101441373 A | 5/2009 |
| CN | 101487963 A | 7/2009 |
| CN | 101592938 A | 12/2009 |
| CN | 101640825 A | 2/2010 |
| CN | 101825890 A | 9/2010 |
| CN | 102116950 A | 7/2011 |
| CN | 101661200 B | 12/2011 |
| CN | 102841716 A | 12/2012 |
| CN | 103115299 A | 6/2013 |
| CN | 103426416 | 12/2013 |
| CN | 103477384 A | 12/2013 |
| CN | 105045246 A | 11/2015 |
| CN | 105575305 A | 5/2016 |

OTHER PUBLICATIONS

International Search Report and Written Opinion in PCT/CN2016/083125 dated Nov. 29, 2016, with English translation.
"First office action," CN Application No. 201610154528.3 (dated Dec. 12, 2017).

\* cited by examiner

CIRCUIT AND METHOD FOR REPAIRING SIGNAL LINE DISCONNECTION AND DISPLAY PANEL

RELATED APPLICATION

The present application is the U.S. national phase entry of PCT/CN2016/083125, with an international filling date of May 24, 2016, which claims the benefit of Chinese Patent Application No. 201610154528.3, titled "Circuit and method for repairing signal line disconnection and display panel", filed on Mar. 17, 2016, the entire disclosure of which is incorporated herein by reference.

FIELD

The present disclosure relates to the field of display technologies, and particularly to a circuit and method for repairing signal line disconnection, and an associated display panel.

BACKGROUND

With continuous development of display technologies, displays are widely applied to various electronic devices. For further implementing human-machine interaction and improving user experience, touch display panels have been proposed in prior art. In-cell touch display panels represent the main trend of touch display technologies.

An in-cell touch display panel comprises gate lines and data lines for displaying, and signal lines for touch control (simply referred to as touch control signal lines), which can be collectively referred to as signal lines. There may be scenarios for an in-cell touch display panel where gate lines and data lines share common control signal lines. In an event that disconnection occurs in gate lines, data lines, or touch control signal lines, which results in poor signal transmission, normal operations of a touch display panel may be impaired. Similar problems also exist in some other forms of substrates.

For disconnection in signal lines, traditional repair approaches are to reserve mending lines on the periphery of array substrates in a display panel. In an event that disconnection occurs in a signal line, the disconnected signal line is checked out manually at first, and then the two ends of a reserved mending line are connected respectively with the two ends of the disconnected signal line manually. Since signals on the disconnected signal line can be conducted via the mending line instead, repair of the disconnection is done. However, for traditional disconnections repair approaches, it is required to make determination on disconnection in signal lines at first, and after that, to repair the disconnection in signal lines. Moreover, during a process of repairing, manual work needs to be involved for several times. Therefore, the traditional approaches are time-consuming and low-efficiency.

SUMMARY

Embodiments of the present disclosure provides a circuit and method for repairing signal line disconnection, and a display panel associated therewith, which alleviate or mitigate at least one of the above issues. According to the first aspect, embodiments of the present disclosure provide a circuit for repairing signal line disconnection, which is applied for repairing disconnection in a first signal line in a substrate. The substrate comprises a second signal line. The circuit comprises: a signal analysis module, a first control module and a second control module. The signal analysis module is connected with a first node and a second node of the first signal line, and arranged for detecting signals at the first node and the second node of the first signal line, generating a control signal based on the signals at the first node and the second node, and outputting the control signal at an output of the signal analysis module. The first control module is connected with the first node of the first signal line, the output of the signal analysis module and a first node of the second signal line, and arranged for conductively connecting the first node of the first signal line with the first node of the second signal line under control of the control signal outputted by the signal analysis module. The second control module is connected with the second node of the first signal line, the output of the signal analysis module and a second node of the second signal line, and arranged for conductively connecting the second node of the first signal line with the second node of the second signal line under control of the control signal outputted by the signal analysis module.

Optionally, the signal analysis module comprises a XOR (Exclusive Or) gate operation unit. A first input of the XOR gate operation unit is connected with the first node of the first signal line; a second input of the XOR gate operation unit is connected with the second node of the first signal line; and an output of the XOR gate operation unit is the output of the signal analysis module.

Optionally, the first control module comprises a first transistor. A first terminal of the first transistor is connected with the first node of the first signal line, a second terminal of the first transistor is connected with the first node of the second signal line, and a gate of the first transistor is connected with the output of the signal analysis module.

Optionally, the second control module comprises a second transistor. A first terminal of the second transistor is connected with the second node of the first signal line, a second terminal of the second transistor is connected with the second node of the second signal line, and a gate of the second transistor is connected with the output of the signal analysis module.

Optionally, the second signal line is shared by a plurality of circuits for repairing signal line disconnection.

Optionally, the substrate is a substrate in a display panel.

Optionally, the first signal line is a gate line, the second signal line is a touch control signal line; or the first signal line is a touch control signal line and the second signal line is a gate line.

Optionally, the first signal line is a data line, the second signal line is a touch control signal line; or the first signal line is a touch control signal line and the second signal line is a data line.

Optionally, the first signal line and the second signal line are arranged on different layers in the substrate.

According to the second aspect, embodiments of the present disclosure provide a driving method used with a circuit for repairing signal line disconnection, which is applied for repairing disconnection in a first signal line in a substrate. The substrate comprises a second signal line. The method comprises: obtaining signals at a first node and a second node of the first signal line; outputting a control signal under control of the signals at the first node and the second nodes; conductively connecting the first node of the first signal line with a first node of the second signal line, and conductively connecting the second node of the first signal line with a second node of the second signal line, under control of the control signal.

Optionally, outputting a control signal under control of the signals at the first node and the second nodes comprises: outputting the control signal when the signal at the first node is different from that at the second node.

Optionally, outputting the control signal when a signal at the first node is different from that at the second node comprises: outputting the control signal when the signal at the first node is at high level and the signal at the second node is at low level; or outputting the control signal when the signal at the first node is at low level and the signal at the second node is at high level.

According to the third aspect, embodiments of the present disclosure provide a display panel, which comprises a circuit for repairing signal line disconnection as described in any one of the first aspect.

Optionally, the signal analysis module of the circuit for repairing signal line disconnection is disposed on a non-display area of an array substrate in the display panel.

The circuit for repairing signal line disconnection as provided in embodiments of the present disclosure can conductively connect a first node of a first signal line with a first node of a second signal line and a second node of the first signal line with a second node of the second signal line when there is disconnection between the first and second nodes of the first signal line in a display panel. Thus, repair of disconnection in signal lines can be realized by conducting signals that were in the first signal line via the second signal line instead. Since repair of disconnection in signal lines can be done automatically by a circuit for repairing signal line disconnection as provided in embodiments of the present disclosure, the process of repairing disconnections in signal lines can be simplified and in turn the efficiency can be improved.

BRIEF DESCRIPTION OF THE DRAWINGS

The present disclosure will be better understood and its numerous objects and advantages will become more apparent to those skilled in the art by reference to the following drawings, in conjunction with the accompanying detailed description.

DETAILED DESCRIPTION

The technical solutions in embodiments of the present disclosure will be described below clearly and thoroughly with reference to the accompanying drawings in embodiments of the present disclosure.

Apparently, the described embodiments are merely intended to be exemplary and not limiting. It is to be understood by those ordinary skilled in the art that embodiments of the present disclosure described below can be varied and modified in accordance with various approaches without departing from the scope of the present disclosure.

All of transistors employed in embodiments of the present disclosure can be thin film transistors, field-effect transistors, or other elements with same characteristics. In some embodiments, transistors employed in embodiments of the present disclosure are mainly switching transistors, depending on their functions in circuits. Since a source and a drain of a switching transistor used herein are symmetry, they are interchangeable. In embodiments of the present disclosure, in order to distinguish the two electrodes other than the gate in a transistor, the source is referred to as the first terminal, and the drain is referred to as the second terminal. According to the modality shown in the appended figures, the middle terminal of the transistor is the gate, the input signal terminal is the source and the output signal terminal is the drain. Moreover, switching transistors employed in embodiments of the present disclosure can include P-type and/or N-type switching transistors. P-type switching transistors are turned on when the gate is at low level and turned off when the gate is at high level, while N-type switching transistors are turned on when the gate is at high level and turned off when the gate is at low level.

It should be noted that, the expressions "first", "second" and the like in the present application are merely for the purpose of distinguishing between the same or similar items with substantially the same functions and effects. The expressions "first", "second" and the like do not limit quantity or orders of operation.

Figure 1:
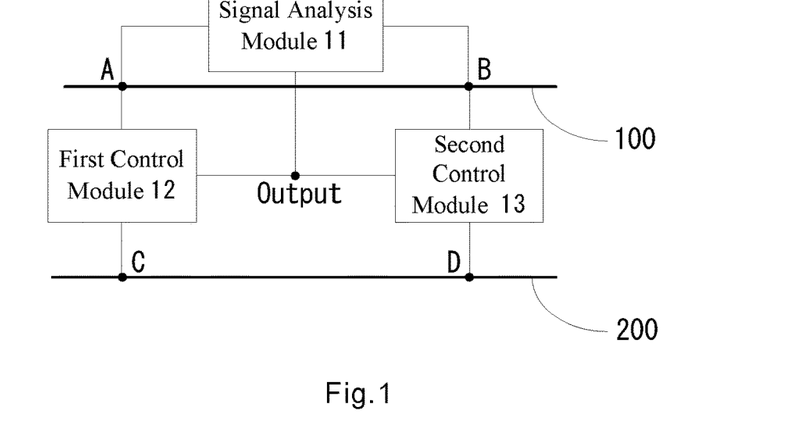
FIG. 1 illustrates a schematic structural diagram of a circuit for repairing signal line disconnection as provided in embodiments of the present disclosure.

FIG. 1 shows a schematic structural diagram of a circuit for repairing signal line disconnection provided in embodiments of the present disclosure. The circuit for repairing signal line disconnection is used to repair disconnection(s) in signal line(s) in a substrate. The substrate can be a substrate in a display panel, or in array photosensitive devices (such as photosensitive devices in cameras or in infrared imagers, or X-ray photosensitive devices).

Referred to FIG. 1, the substrate comprises a first signal line 100 and a second signal line 200. The circuit for repairing signal line disconnection comprises: a signal analysis module 11, a first control module 12 and a second control module 13.

The signal analysis module 11 is connected with a first node A and a second node B of the first signal line 100, and is arranged for detecting signals at the first node A and the second node B of the first signal line 100, and outputting a control signal at an output 'Output' of the signal analysis module 11 based on the signals at the first node A and the second node B of the first signal line 100 (e.g., under control of the signals at the first node A and the second node B of the first signal line 100).

The first control module 12 is connected with the first node A of the first signal line 100, the output 'Output' of the signal analysis module 11 and a first node C of the second signal line 200, and is arranged for conductively connecting the first node A of the first signal line 100 with the first node C of the second signal line 200 under control of the control signal outputted by the signal analysis module 11.

The second control module 13 is connected with the second node B, the output 'Output' of the signal analysis module 11, and a second node D of the second signal line 200, and is arranged for conductively connecting the second node B of the first signal line 100 with the second node D of the second signal line 200 under control of the control signal outputted by the signal analysis module 11.

In some embodiments, the first signal line can be a signal line that is possibly disconnected and thus waits to be repaired, and the second signal line is a signal line that is provisioned for repairing the disconnected signal line. By conducting signals in the first signal line via the second signal line instead when there is disconnection between a first node and a second node of the first signal line in the substrate, the circuit for repairing signal line disconnection provided in embodiments of the present disclosure performs automatic repair of disconnection in a signal line. It can simplify the repair process of signal line disconnection, and thus improve the efficiency of repairing disconnected signal lines and save labor costs.

In some embodiments, the substrate can be a substrate in a display panel. The display panel employed in embodiments of the present disclosure can include an array substrate and a color film substrate. The first signal line can be a gate line, a data line, a common electrode line, a touch control driving signal line, a touch control induction signal line, etc. The second signal line described in the present disclosure can also be a gate line, a data line, a common electrode line, a touch control driving signal line, a touch control induction signal line, etc. Data lines and gate lines are arranged on the array substrate in the display panel. Touch control signal lines (which include touch control driving signal lines and touch control induction signal lines) can be arranged on the array substrate or the color film substrate in the display panel.

In an example, the first signal line and the second signal line can be two gate lines separately. In this example, if one of the gate lines is disconnected, it can be repaired by means of the circuit for repairing signal line disconnection as described in the above embodiments. The two gate lines can receive gate signals at the same time after repair is done. In another example, two data lines are arranged as the first signal line and the second signal line respectively. In this example, after repair is done by the circuit for repairing signal line disconnection as described in the above embodiments, data signals are inputted into the two repaired data lines simultaneously. In yet another example, a touch control signal line and a gate line are arranged as the first signal line and the second signal line respectively, or a touch control signal line and a data line are arranged as the first signal line and the second signal line respectively. In this example, display apparatus is driven in a manner of time-division-driven, namely dividing a time frame into a display driving phase and a touch control driving phase, after repair is performed, and then the second signal line is used to conduct display driving signals during the display driving phase, and is reused to conduct touch control driving signals during the touch control driving phase. Surely the above is only for the purpose of illustration and the present disclosure is not limited to this. As would be appreciated, those skilled in the art can also arrange other signal lines to be the first and second signal lines as described in the above embodiments. It can be understood from the technical solutions in the above embodiments that the circuit for repairing signal line disconnection as provided in the above embodiments can repair signal line disconnection between a first node and a second node of the first signal line.

In some embodiments, the first node and the second node of the first signal line can be positioned differently. In an example, it is assumed that the first signal line is a gate line and a gate driving circuit is near the first column of pixels. In this example, the first node of the first signal line can be positioned at the gate input of the first column of pixels on the gate line, and the second node of the first signal line can be positioned at the gate input of the last column of pixels on the gate line. In this way, signal line disconnection corresponding to the whole row of pixels can be repaired. Alternatively, when the first signal line is a gate line, the first node of the first signal line can be positioned at an output of the gate driving circuit, and the second node of the first signal line can be positioned at the gate input of the first column of pixels on the gate line. In this way, the signal line disconnection occurred between the output of the gate driving circuit and the first pixel can be repaired. Optionally, when the first signal line is a gate line, the first node of the first signal line can be positioned at an output of the gate driving circuit, and the second node of the first signal line can be positioned at the gate input of the last pixel in the row of pixels to which the gate line corresponds. In this way, the signal line disconnection between the output of the gate driving circuit and the last pixel can be repaired.

Similarly, when the first signal line is a data line, a touch control signal line or some other signal line, repair of disconnections in different locations of the first signal line can also be implemented by suitably positioning the first node and the second node on the first signal line in a manner similar to the above ones.

It is also to be noted that, the first node C and the second node D of the second signal line 200 in the above embodiments can be any two points on the second signal line. In some embodiment, in order to reduce wiring distance of the circuit for repairing signal line disconnection, locations of the first node C and the second node D of the second signal line 200 can be selected such that the first and second control modules can be vertically connected with the second signal line 200 respectively.

In some embodiments, the first signal line is arranged in parallel with the second signal line. In an example, the first and second signal line can be arranged on the same layer, and are insulated from each other, or be arranged on different layers. For example, the first signal line and the second signal line can also be arranged on different layers of an array substrate. For example, the first signal line may be on a gate metal layer of the array substrate, and the second signal line may be on a data metal layer of the array substrate. The parallel arrangement of the first and second signal lines can reduce wiring distance of the circuit for repairing signal line disconnection, and in turn simplify fabrication and reduce costs of production.

As would be understood, though the above embodiments are described in the context of display panels, the present disclosure is not limited to this. On the contrary, a circuit for repairing signal line disconnection in embodiments of the present disclosure can also be applied to array photosensitive devices, such as photosensitive devices in cameras or in infrared imagers, or X-ray photosensitive devices.

Figure 2:
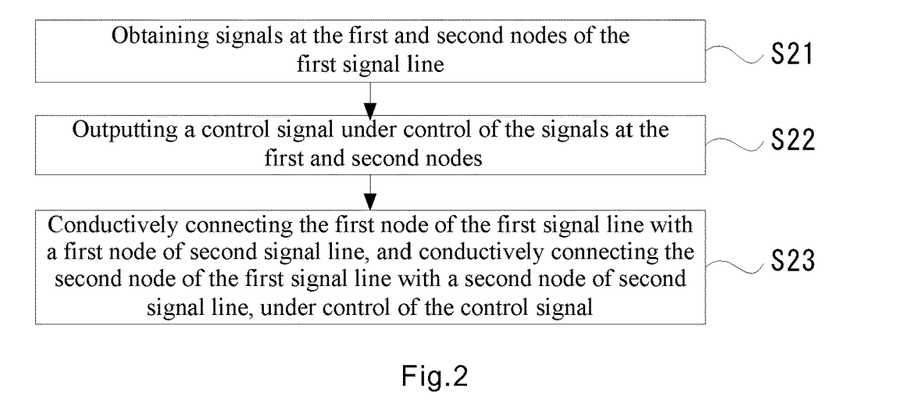
FIG. 2 illustrates a flow chart of a driving method used with a circuit for repairing signal line disconnection as provided in embodiments of the present disclosure.

FIG. 2 shows a flow chart of a driving method used with a circuit for repairing signal line disconnection as provided in embodiments of the present disclosure. The driving method is used to repair disconnection in a first signal line in a substrate, wherein the substrate further comprises a second signal line. Referring to FIG. 2, the method comprises:

S21, obtaining signals at the first node and at the second node of the first signal line.

S22, outputting a control signal under control of the signals at the first node and at the second node (i.e., based on the signals at the first and second nodes). Optionally, the control signal is outputted when the signals at the first and second nodes meet a set condition.

S23, conductively connecting the first node of the first signal line with a first node of the second signal line, and conductively connecting the second node of the first signal line with a second node of the second signal line, under control of the control signal. Namely, the control signal is a signal for conductively connecting the first node of the first signal line is with the first node of the second signal line, and conductively connecting the second node of the first signal line with the second node of the second signal line.

In an example, if the control signal is used to control switching transistors, it is a switch-on signal for switching on the switching transistors.

According to the driving method used with the circuit for repairing signal line disconnection as provided in embodiments of the present disclosure, when there is disconnection between a first node and a second node of a first signal line in a substrate, the first node of the first signal line and a first node of the second signal line can be conductively connected, and the second node of the first signal line and a second node of the second signal line can be conductively connected. Thus, repair of disconnection in a signal line can be implemented by conducting signals that were in the first signal line via the second signal line instead. Moreover, since the repair of disconnection in a signal line can be done automatically, the process of repairing signal line disconnection can be simplified and then its efficiency can be improved.

In an example, when the signal at the first node is the same as that at the second node, determination is made that there is no disconnection between the two nodes, and then no control signal is outputted at this point. When the signal at the first node is different from that at the second node, determination is made that there is disconnection between the two nodes, and then the disconnection need be repaired at this point. Therefore, exemplarily, outputting a control signal under control of the signals at the first and second nodes in above step 22 can be performed as follows: outputting the control signal when the signal at the first node is different from that at the second node. The control signal would cause the first node of the first signal line and the first node of the second signal line to be conductively connected, and cause the second node of the first signal line and the second node of the second signal line to be conductively connected. Thus, repair of disconnection is done by conducting signals that were in the first signal line via the second signal line instead.

Furthermore, there may be two scenarios as follows in which signals at the first node and the second node are different:

First, the signal at the first node is at high level and the signal at the second node is at low level.

Second, the signal at the first node is at low level and the signal at the second node is at high level.

Therefore, in some embodiments, a control signal is outputted when the signal at the first node is at high level and the signal at the second node is at low level, or a control signal is outputted when the signal at the first node is at low level and the signal at the second node is at high level.

As would be appreciated, the driving method used with the circuit for repairing signal line disconnection in accordance with embodiments of the present disclosure can be applied not only to display panels, but also to array photosensitive devices, such as photosensitive devices in cameras or in infrared imagers, or X-ray photosensitive devices.

Figure 3:
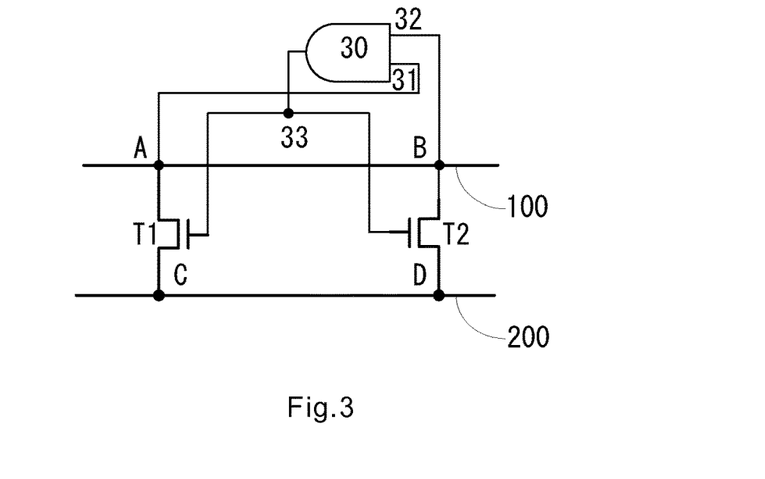
FIG. 3 illustrates an exemplary circuitry of a circuit for repairing signal line disconnection as provided in embodiments of the present disclosure.

FIG. 3 shows an exemplary circuitry of a circuit for repairing signal line disconnection as provided in embodiments of the present disclosure.

Referring to FIG. 3, a signal analysis module 11 comprises: a XOR gate operation unit 30. A first input 31 of the XOR gate operation unit 30 is connected with the first node A of the first signal line 100; a second input 32 of the XOR gate operation unit 30 is connected with the second node B of the first signal line 200; and an output 33 of the XOR gate operation unit 30 is the output 'Output' of the signal analysis module 11.

The first control module 12 comprises: a first transistor T1. The first terminal of the first transistor T1 is connected with the first node A of the first signal line 100, the second terminal of the first transistor T1 is connected with the first node C of the second signal line 200, and the gate of the first transistor T1 is connected with the output 'Output' of the signal analysis module 11.

The second control module 13 comprises: a second transistor T2. The first terminal of the second transistor T2 is connected with the second node B of the first signal line 100, the second terminal of the second transistor T2 is connected with the second node D of the second signal line 200, and the gate of the second transistor T2 is connected with the output 'Output' of the signal analysis module 13.

Below, the operation principle of an approach for repairing signal line disconnection as provided in embodiments of the present disclosure will be discussed with reference to FIGS. 2 and 3, in which the first signal line 100 is a gate line by way of example.

At first, a truth table of the first input 31, the second input 32 and the output 33 of the XOR gate operation unit 30 is shown below as Table 1.

TABLE 1

| First input 31 | Second input 32 | Output 33 |
|---|---|---|
| 1 | 1 | 0 |
| 1 | 0 | 1 |
| 0 | 1 | 1 |
| 0 | 0 | 0 |

As can be seen from the above table, when the signal in the first input 31 is the same as that in the second input 32, no control signal will be outputted from the output, and when the signal in the first input 31 is different from that in the second input 32, a control signal is outputted from the output.

When there is no disconnection between the first node A of the gate line and the second node B of the gate line and scanning is performed by means of the gate line, the first input 31 of the XOR gate operation unit 30 inputs a signal of 1, and the second input 22 of the XOR gate operation unit 30 also inputs a signal of 1. At this time, the output of the XOR gate operation unit 30 outputs a signal of 0. Thus, both of the first transistor T1 and the second transistor T2 are turned off. The display panel transmits gate driving signals via the first signal line; so it can work properly.

When there is no disconnection between the first node A of the gate line and the second node B of the gate line and no scanning is performed by means of the gate line, the first input 31 of the XOR gate operation unit 30 inputs a signal of 0, and the second input 32 of the XOR gate operation unit 30 also inputs a signal of 0. At this time, the output of the XOR gate operation unit 30 outputs a signal of 0. Thus, both of the first transistor T1 and the second transistor T2 are turned off. The display panel transmits gate driving signals via the first signal line; so it can work properly. When there is disconnection between the first node A of the gate line and the second node B of the gate line and a scanning signal is transmitted from the first node A to the second node B via the gate line, the first input 31 of the XOR gate operation unit 30 inputs a signal of 1, while the second input 32 of the XOR gate operation unit 30 inputs a signal of 0. At this time, the output of the XOR gate operation unit 30 outputs a signal of 1, and then both of the first transistor T1 and the second transistor T2 are turned on. Accordingly, the first node A of the first signal line 100 is conductively connected with the first node C of the second signal line 200 via the first transistor T1, and the second node B of the first signal line 100 is conductively connected with the second node D of the second signal line 200 via the second transistor T2. Since the scanning signal that was in the gate line is transmitted to each of pixels connected with the gate line via the second signal line 200 instead, the display panel can still work properly.

Figure 4:
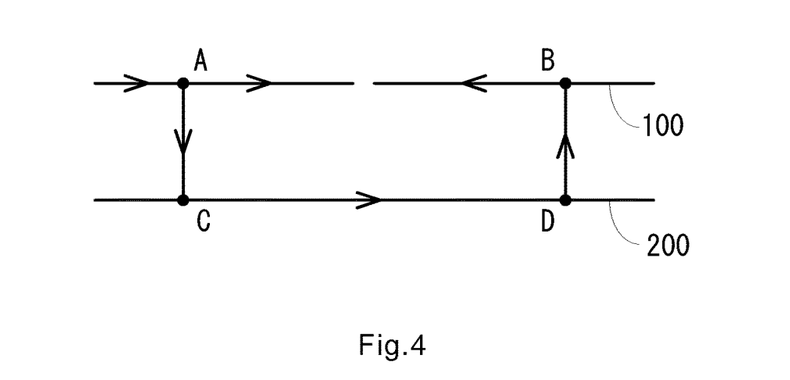
FIG. 4 illustrates a schematic diagram of signal flows in a circuit for repairing signal line disconnection as provided in embodiments of the present disclosure.

FIG. 4 shows a schematic diagram of signal flow in a circuit for repairing signal line disconnection as provided in embodiments of the present disclosure. As shown in FIG. 4, a signal is initially conducted by the first signal line 100 to the first node A. Then the signal is split into two paths. On one path, the signal is conducted to the disconnection location of the first signal line 100, and on the other path, the signal enters the first node C of the second signal line 200 through the first transistor T1 and then is conducted by the second signal line 200 to the second node D.

Finally, the signal goes back to the first signal line 100 through the second transistor T2 at the second node B. Arrows in FIG. 4 represent the direction of signal being conducted.

When there is disconnection between the first node A of the gate line and the second node B of the gate line and a scanning signal is transmitted on the gate line from the second node B to the first node A, the first input 31 of the XOR gate operation unit 30 inputs a signal of 0, and the second input 32 of the XOR gate operation unit 30 inputs a signal of 1. At this time, the output of the XOR gate operation unit 30 outputs a signal of 1, and then both of the first transistor T1 and the second transistor T2 are turned on. As such, the first node A of the first signal line 100 is conductively connected with the first node C of the second signal line 200 through the first transistor T1, and the second node B of the first signal line 100 is conductively connected with the second node D of the second signal line 200 through the second transistor T2. Since the scanning signal is transmitted to each of pixels connected with the gate line via the second signal line 200 instead, the display panel can also work properly.

Figure 5:
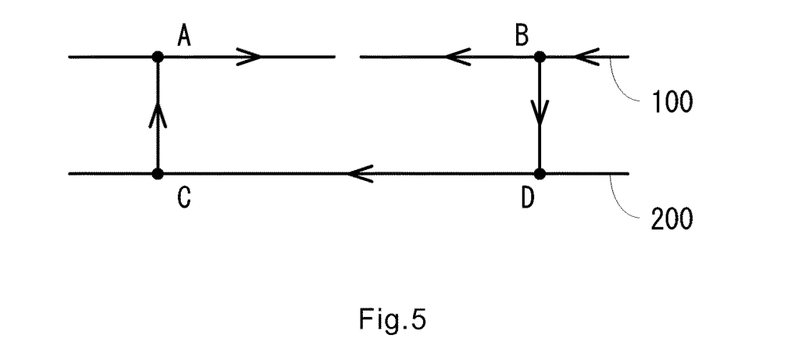
FIG. 5 illustrates another schematic diagram of signal flows in a circuit for repairing signal line disconnection as provided in embodiments of the present disclosure.

FIG. 5 shows another schematic diagram of signal flow in the circuit for repairing signal line disconnection as provided in embodiments of the present disclosure. As shown in FIG. 5, a signal is initially conducted by the first signal line 100 to the second node B. Then the signal is split into two paths. On one path, the signal is conducted to the disconnection location of the first signal line 100, and on the other path, the signal enters the second node D of the second signal line 200 through the second transistor T2 and then is conducted to the first node C via the second signal line 200. Finally, the signal goes back to the first signal line 100 through the first transistor T1 at the first node A. Arrows in FIG. 5 represent the direction of signal being conducted.

As described above, a circuit for repairing signal line disconnection as provided in embodiments of the present disclosure can implement repair when there is disconnection in a signal line, for example between a start point and an end point of the signal line, in order to guarantee that the display panel works properly.

Furthermore, all of the transistors in a circuit for repairing signal line disconnection as provided in embodiments of the present disclosure can be N-type transistors which are turned on at high level, or P-type transistors is which are turned on at low level. If all of transistors are N-type transistor, output of the XOR gate logic operation unit 30 is at low level when it outputs a truth value of 0, and output of the XOR gate logic operation unit 30 is at high level when it outputs a truth value of 1. If all of the transistors are P-type transistors, output of the XOR gate logic operation unit 30 is at high level when it outputs a truth value of 0, and output of the XOR gate logic operation unit 30 is at low level when it outputs a truth value of 1.

In an example, a plurality of circuits for repairing signal line disconnection as provided in embodiments of the present disclosure share one and the same second signal line.

Figure 6:
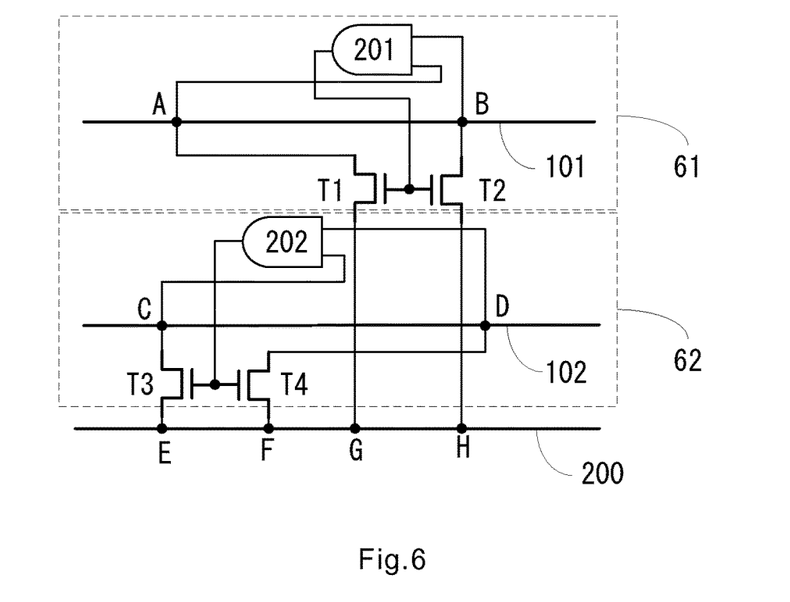
FIG. 6 illustrates another exemplary circuitry of a circuit for repairing signal line disconnection as provided in embodiments of the present disclosure.

FIG. 6 shows another exemplary circuitry of a circuit for repairing signal line disconnection as provided in embodiments of the present disclosure. In FIG. 6, two circuits 61, 62 for repairing signal line disconnection are shown, with both of them sharing a common second signal line 200.

The circuit 61 for repairing signal line disconnection comprises a XOR gate logic operation unit 201 and transistors T1, T2. A first input and a second input of the XOR gate logic operation unit 201 are connected with a node A and a node B of a signal line 101 respectively. Gates of the transistors T1, T2 are connected with output of the XOR gate logic operation unit 201, wherein a first terminal of T1 is connected with the node A, and a second terminal of T1 is connected with a node G, and a first terminal of T2 is connected with the node B, and a second terminal of T2 is connected with a node H. The circuit 62 for repairing signal line disconnection comprises a XOR gate logic operation unit 202 and transistors T3, T4. A first input and a second input of the XOR gate logic operation unit 202 are connected with a node C and a node D of the signal line 102 respectively. Gates of the transistors T3, T4 are connected with the output of the XOR gate logic operation unit 202, wherein a first terminal of T3 is connected with the node C, and a second terminal of T3 is connected with a node E, and a first terminal of T4 is connected with the node D, and a second terminal of T4 is connected with a node F. Here, the signal line segment between the node E and the node F and the signal line segment between the node G and the node H can occupy the same segment of the second signal line 200 or respectively occupy different segments of the second signal line 200. The operation principle of the circuits 61, 62 for repairing signal line disconnection is the same as that of the circuit for repairing signal line disconnection as provided in the above embodiments.

As would be understood, though FIG. 6 shows that two circuits for repairing signal line disconnection are sharing a common second signal line, the present disclosure is not limited to this. Other numbers (for example, 3, 4 and the like) of circuits for repairing signal line disconnection sharing a common second signal line can be envisaged by those skilled in the art. With a plurality of circuits for repairing signal line disconnection sharing a common second signal line, the number of pre-set second signal lines can be decreased, and thus production process is simplified and production costs are reduced.

In-cell touch display panels are widely applied in the field of touch display. Generally, an in-cell touch display panel can reuse data lines or gate lines as touch control signal lines of the in-cell touch display panel, and provide touch control driving signals to touch control electrodes via the touch control signal lines. During the process of touch display driving, it is required that a frame of signal is divided into a display phase and a touch control phase. During the display phase, gate lines or data lines conduct display signals, and during the touch control phase, gate lines or data lines conduct touch control signals. In such a touch display panel where data lines or gate lines are reused as touch control signal lines, the circuit for repairing signal line disconnection as provided in embodiments of the present disclosure can be applied by separately fabricating a second signal line.

In a touch display panel comprising separate data lines, gate lines and touch control signal lines, a second signal line can be arranged in the following ways when applying the circuit for repairing signal line disconnection in accordance with embodiments of the present disclosure.

Figure 7:
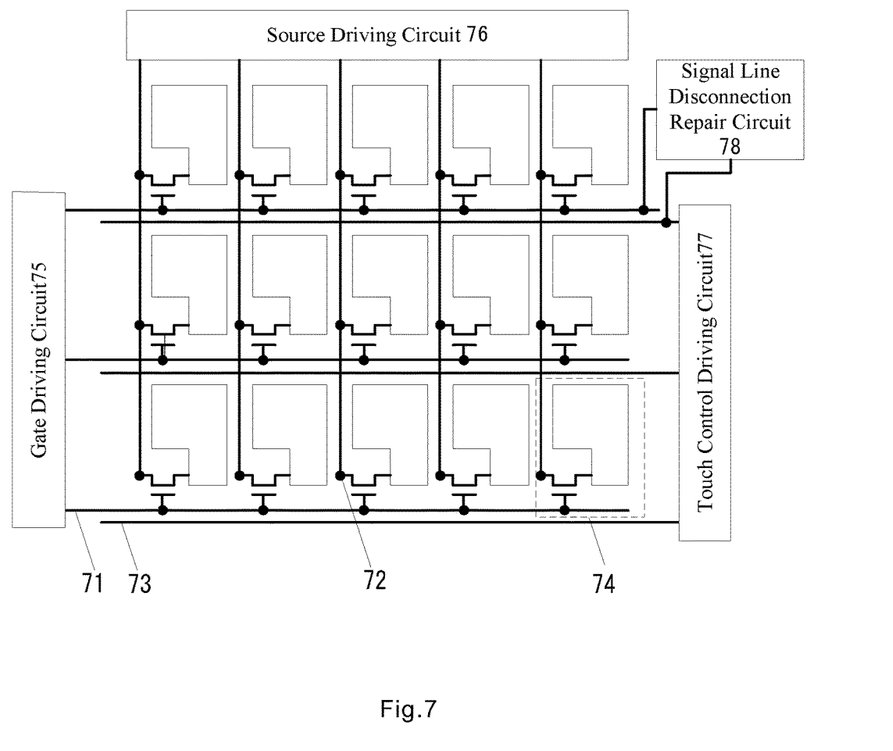
FIG. 7 illustrates a schematic structural diagram of a display panel provided in embodiments of the present disclosure.

FIG. 7 shows a schematic structural diagram of a display panel as provided in embodiments of the present disclosure. Referring to FIG. 7, the display panel comprises a plurality of gate lines 71 in parallel with each other, a plurality of data lines 72 in parallel with each other, a plurality of touch control signal lines 73 in parallel with each other and a plurality of pixels 74. The gate lines 71 are in parallel with the touch control signal lines 73. The gate lines 71 connect with corresponding rows of pixels 74, for transmitting gate driving signals outputted by a gate driving circuit 75. The data lines 72 connect with corresponding columns of pixels 74, for transmitting source driving signals outputted by a source driving circuit 76 to pixels 74. The touch control signal lines 73 are used for transmitting touch control driving signals outputted by a touch control driving circuit 77.

In an example, a first signal line can be a gate line, and a second signal line can be a touch control signal line.

The signal line disconnection repair circuit 78 is connected with a gate line 71 and a touch control signal line 73 respectively, and takes the gate line 71 as the first signal line and the touch control signal line 73 as the second signal line. Thus, repair of disconnection(s) occurred on gate lines in the display panel is realized.

In another example, the first signal line can be a touch control signal line and the second signal lines can be a gate line.

In this example and also referring to FIG. 7, the signal line disconnection repair circuit 78 can be connected with the gate line 71 and the touch control signal line 73 respectively, and takes the gate line 71 as the second signal line and the touch control signal line 73 as the first signal line. Thus, repair of the disconnection(s) occurred on touch control signal lines in the display panel is realized.

Though the signal line disconnection repair circuit 78 in FIG. 7 is shown as being connected at a point with the first signal line and the second signal line respectively, it is to be understood by those skilled in the art that this is only by way of example. In specific implementation, the circuit for repairing signal line disconnection would be respectively connected with two nodes on the first signal line that are related to disconnection to be repaired, and with two nodes on the second signal line that are related to a signal line segment for repairing disconnection.

Figure 8:
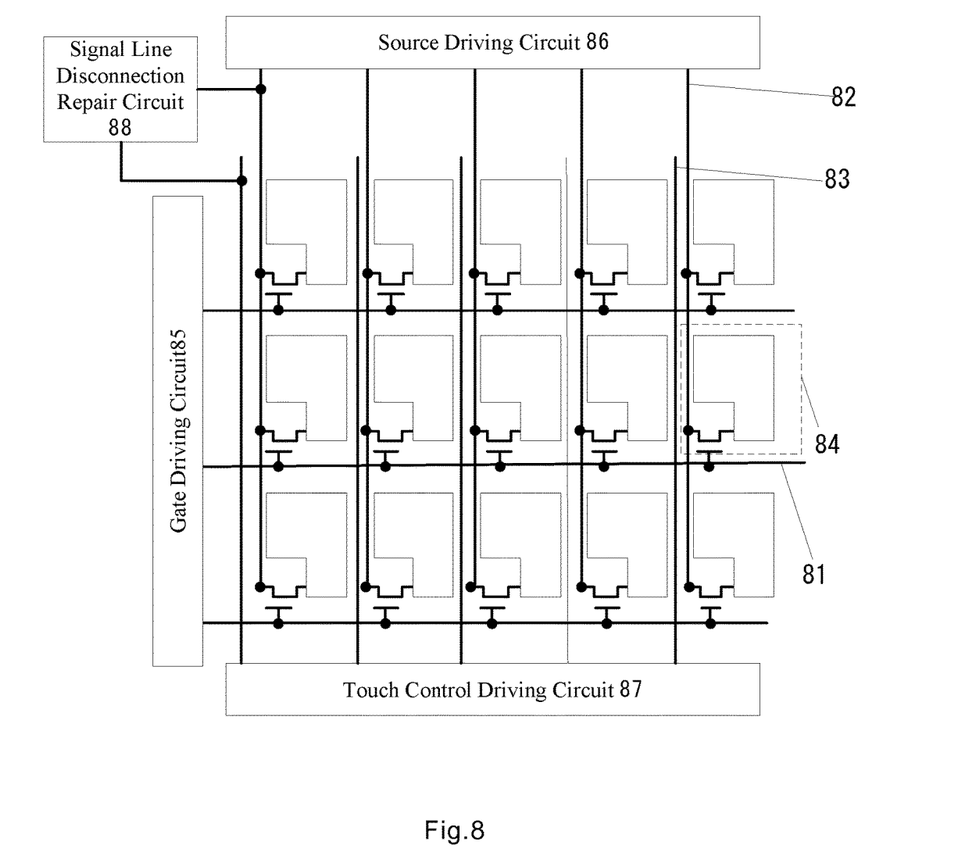
FIG. 8 illustrates another schematic structural diagram of a display panel provided in embodiments of the present disclosure.

FIG. 8 shows another schematic structural diagram of a display panel as provided in embodiments of the present disclosure. Referring to FIG. 8, the display panel comprises a plurality of gate lines 81 in parallel with each other, a plurality of data lines 82 in parallel with each other, a plurality of touch control signal lines 83 in parallel with each other and a plurality of pixels 84. The data lines 82 are in parallel with the touch control signal lines 83. The gate lines 81 connect with corresponding rows of pixels 84, for transmitting gate driving signals outputted by a gate driving circuit 85. The data lines 82 connect with corresponding columns of pixels 84, for transmitting source driving signals outputted by a source driving circuit 86 to pixels 84. The touch control signal lines 83 are used for transmitting touch control driving signals outputted by a touch control driving circuit 87.

In an example, a first signal line can be a data line, and a second signal line can be a touch control signal line.

The signal line disconnection repair circuit 88 is connected with the data lines 82 and the touch control signal lines 83 respectively, and takes a data line 82 as the first signal line and a touch control signal line 83 as the second signal line. Thus, repair of disconnection(s) occurred on data lines in the display panel is realized.

In another example, the first signal line can be a touch control signal line and the second signal line can be a data line.

In this example, also referring to FIG. 8, the signal line disconnection repair circuit 88 can be connected with the data lines 82 and the touch control signal lines 83 respectively, and takes a data line 82 as the second signal line and a touch control signal line 83 as the first signal line. Thus, repair of disconnection(s) occurred on touch control signal lines in the display panel is realized.

Though the signal line disconnection repair circuit 88 is shown in FIG. 8 as being connected at a point with the first signal lines and the second signal lines respectively, it is to be understood by those skilled in the art that this is only by way of example. In specific implementation, the circuit for repairing signal line disconnection would be respectively connected with two nodes on the first signal line that are related to the disconnection to be repaired, and with two nodes on the second signal line that are related to a signal line segment for repairing disconnection.

The display panels provided by embodiments of the present disclosure comprise a circuit for repairing signal line disconnection as provided by any one of the above embodiments. In some embodiments, the display panel can be any of products or components with a display function, such as electronic paper, cell phones, tablet computers, TVs, displays, notebooks, digital photo frames, navigators and the like.

In some embodiments, the circuit for repairing signal line disconnection is fabricated on a display panel, and the signal analysis module of the circuit for repairing signal line disconnection is disposed on a non-display area of an array substrate in the display panel.

By disposing the signal analysis module of the circuit for repairing signal line disconnection on a non-display area of the array substrate in the display panel, the signal analysis module of the circuit for repairing signal line disconnection can be formed in synchronization with other prior structures on the array substrate through conventional patterning processes. Thus, a separate additional production process for fabricating the signal analysis module of the circuit for repairing signal line disconnection can be omitted.

Moreover, the signal analysis module of the circuit for repairing signal line disconnection can also be integrated into a gate driving chip to be used for forming a gate driving circuit, or into a source driving chip to be used for forming a source driving circuit. As a result of integrating the signal analysis module of the circuit for repairing signal line disconnection into a gate driving chip or a source driving chip, a separate additional production process for fabricating the signal analysis module of the circuit for repairing signal line disconnection can be omitted.

Although the present disclosure have been described and shown with respect to one or more implementations, the protection scope of the present disclosure is not limited to this. Equivalent modifications and alternations will occur to those skilled in the art based on a reading and understanding of this specification and the accompanying drawings. The present disclosure comprises all such modifications and alternations. Therefore, the protection scope of the present disclosure is limited only by the scope of the enclosed claims.

The invention claimed is:

1. A circuit for repairing signal line disconnection, being applied for repairing disconnection in a first signal line in a substrate, the substrate further comprising a second signal line, the circuit for repairing signal line disconnection comprising:
   a signal analysis module connected with a first node and a second node of the first signal line, being arranged for detecting signals at the first node and the second node of the first signal line, generating a control signal based on the signals at the first node and the second node, and outputting the control signal at an output of the signal analysis module;
   a first control module connected with the first node of the first signal line, the output of the signal analysis module and a first node of the second signal line, being arranged for conductively connecting the first node of the first signal line with the first node of the second signal line under control of the control signal outputted by the signal analysis module; and
   a second control module connected with the second node of the first signal line, the output of the signal analysis module and a second node of the second signal line, being arranged for conductively connecting the second node of the first signal line with the second node of the second signal line under control of the control signal outputted by the signal analysis module.

2. The circuit for repairing signal line disconnection as claimed in claim 1, wherein the signal analysis module comprises: a XOR gate operation unit;
   a first input of the XOR gate operation unit is connected with the first node of the first signal line; a second input of the XOR gate operation unit is connected with the second node of the first signal line; and an output of the XOR gate operation unit is the output of the signal analysis module.

3. The circuit for repairing signal line disconnection as claimed in claim 1, wherein the first control module comprises: a first transistor;
   a first terminal of the first transistor is connected with the first node of the first signal line, a second terminal of the first transistor is connected with the first node of the second signal line, and a gate of the first transistor is connected with the output of the signal analysis module.

4. The circuit for repairing signal line disconnection as claimed in claim 1, wherein the second control module comprises: a second transistor;
   a first terminal of the second transistor is connected with the second node of the first signal line, a second terminal of the second transistor is connected with the second node of the second signal line, and a gate of the second transistor is connected with the output of the signal analysis module.

5. The circuit for repairing signal line disconnection as claimed in claim 1, wherein the second signal line is shared by a plurality of circuits for repairing signal line disconnection.

6. The circuit for repairing signal line disconnection as claimed in claim 1, wherein the substrate is a substrate in a display panel.

7. The circuit for repairing signal line disconnection as claimed in claim 6, wherein the display panel is a touch display panel and comprises separate gate lines and touch control signal lines, the first signal line is a gate line, the second signal line is a touch control signal line; or the first signal line is a touch control signal line and the second signal line is a gate line.

8. The circuit for repairing signal line disconnection as claimed in claim 6, wherein the display panel is a touch display panel and comprises separate gate lines and touch control signal lines, the first signal line is a data line, the second signal line is a touch control signal line; or the first signal line is a touch control signal line and the second signal line is a data line.

9. The circuit for repairing signal line disconnection as claimed in claim 1, wherein the first signal line and the second signal line are arranged on different layers in the substrate.

10. A display panel comprising a circuit for repairing signal line disconnection as claimed in claim 1.

11. The display panel as claimed in claim 10, wherein the signal analysis module of the circuit for repairing signal line disconnection is disposed on a non-display area of an array substrate in the display panel.

12. The display panel as claimed in claim 10, wherein the signal analysis module comprises: a XOR gate operation unit;
   a first input of the XOR gate operation unit is connected with the first node of the first signal line; a second input of the XOR gate operation unit is connected with the second node of the first signal line; and an output of the XOR gate operation unit is the output of the signal analysis module.

13. The display panel as claimed in claim 10, wherein the first control module comprises: a first transistor;
   a first terminal of the first transistor is connected with the first node of the first signal line, a second terminal of the first transistor is connected with the first node of the second signal line, and a gate of the first transistor is connected with the output of the signal analysis module.

14. The display panel as claimed in claim 10, wherein the second control module comprises: a second transistor;
   a first terminal of the second transistor is connected with the second node of the first signal line, a second terminal of the second transistor is connected with the second node of the second signal line, and a gate of the second transistor is connected with the output of the signal analysis module.

15. The display panel as claimed in claim 10, wherein the second signal line is shared by a plurality of circuits for repairing signal line disconnection.

16. The display panel as claimed in claim 10, wherein the first signal line and the second signal line are arranged on different layers in the substrate.

17. A method for repairing signal line disconnection, being applied for repairing disconnection in a first signal line in a substrate, the substrate further comprising a second signal line, the method comprising:

obtaining signals at a first node and a second node of the first signal line;

outputting a control signal based on the signals at the first node and the second node; and     conductively connecting the first node of the first signal line with a first node of the second signal line, and conductively connecting the second node of the first signal line with a second node of the second signal line, under control of the control signal.

18. The method for repairing signal line disconnection as claimed in claim 17, wherein outputting the control signal based on the signals at the first node and the second node comprises: outputting the control signal when the signal at the first node is different from the signal at the second node.

19. The method for repairing signal line disconnection as claimed in claim 18, wherein outputting the control signal when the signal at the first node is different from the signal at the second node comprises:

outputting the control signal when the signal at the first node is at high level and the signal at the second node is at low level; or     outputting the control signal when the signal at the first node is at low level and the signal at the second node is at high level.

20. The method for repairing signal line disconnection as claimed in claim 17, wherein the substrate is a substrate in a display panel.

* * * * *

UNITED STATES PATENT AND TRADEMARK OFFICE
CERTIFICATE OF CORRECTION

PATENT NO.        : 10,002,917 B2
APPLICATION NO.   : 15/532471
DATED             : June 19, 2018
INVENTOR(S)       : Jingbo Xu, Hongbo Feng and Yingzi Wang

Page 1 of 1

It is certified that error appears in the above-identified patent and that said Letters Patent is hereby corrected as shown below:

In the Claims

In Claim 20, Column 15, Lines 28-29, delete the phrase "the substrate is a substrate in a display panel" and replace with --the first signal line and the second signal line are arranged on different layers in the substrate--.

Signed and Sealed this
Fifteenth Day of January, 2019

Andrei Iancu
*Director of the United States Patent and Trademark Office*